US007719259B2

(12) United States Patent
Mirow (10) Patent No.: US 7,719,259 B2
(45) Date of Patent: May 18, 2010

(54) TEMPERATURE STABLE CURRENT SENSOR SYSTEM

(76) Inventor: Fred Mirow, 118 Cornell Rd., Bala Cynwyd, PA (US) 19004

( * ) Notice: Subject to any disclaimer, the term of this patent is extended or adjusted under 35 U.S.C. 154(b) by 154 days.

(21) Appl. No.: 12/080,511

(22) Filed: Apr. 3, 2008

(65) Prior Publication Data
US 2009/0045801 A1 Feb. 19, 2009

Related U.S. Application Data

(60) Provisional application No. 61/000,617, filed on Oct. 26, 2007, provisional application No. 60/964,902, filed on Aug. 15, 2007.

(51) Int. Cl.
*G01R 1/20* (2006.01)
(52) U.S. Cl. .................. 324/126; 324/123 R; 324/1
(58) Field of Classification Search ................ None
See application file for complete search history.

(56) References Cited

U.S. PATENT DOCUMENTS

| 3,330,954 | A | * | 7/1967 | Harrison et al. ............. 376/255 |
| 3,333,092 | A | * | 7/1967 | Hauser, Jr. ................. 708/824 |
| 3,431,490 | A | * | 3/1969 | Kwap et al. ................ 324/617 |
| 4,276,510 | A | * | 6/1981 | Tompkins et al. .......... 324/127 |

* cited by examiner

*Primary Examiner*—Vinh P Nguyen (57) ABSTRACT

A current sensor system that uses a sensor resistor to sense current flow and in which the level of voltage drop across that resistor is used to control the current flow through another resistor, the input resistor, into a current integrator. The ratio of input resistor to sensor resistor resistance values determines the ratio of sense current to integrator input current level. By matching the temperature coefficients of the resistors the effects of temperature are reduced. The integrator output provides either directly or indirectly a voltage level, frequency, or duty cycle output signal to indicate the sensor resistor current level.

9 Claims, 9 Drawing Sheets

TEMPERATURE STABLE CURRENT SENSOR SYSTEM

CROSS-REFERENCE TO RELATED APPLICATIONS

The benefits of filing this invention as Provisional application for patents "Temperature stable current sensor system", U.S. PTO 61/000,617 filed Oct. 26, 2007 and "Temperature stable current sensor system", U.S. PTO 60/964,902 filed Aug. 15, 2007 by Fred Mirow are claimed.

BACKGROUND OF THE INVENTION

This invention relates to current sensor system, and more particularly, methods for using matched temperature coefficient resistors to reduce measurement error.

BRIEF SUMMARY OF THE INVENTION

According to this invention, a sensor resistor is used to sense current flow in which the voltage drop across that resistor is used to determine the current flow through another resistor, the input resistor, into a current integrator. The voltage level across the input resistor is proportional to the voltage level across sensor resistor which along with the ratio of input resistor to sensor resistor resistance values determines the ratio of sense resistor current to integrator input current level.

By constructing the resistors of the same material, as is easily done in integrated circuits, the temperature performance of the sensor resistor and input resistor can be made substantially identical. Since the resistance ratio of these two resistors remain substantially constant, the ratio of current through current sensor resistor to the integrator input current also remains substantially constant over temperature variations. Also, since the ratio of sensor current to integrator input current depends on the resistance ratio and not the absolute resistor values, the need for resistor trimming is reduced. It is understood that constant current or voltage gain amplifiers maybe used to additionally adjust the ratio of the sensor resistor to input resistor current level without changing the basic principle of circuit operation.

Current integrators can be built using many well known in the art circuits including those using op-amps in combination with capacitors. The integrator output voltage equals the integral over time of the current level into it divided by the capacitor value. The integrator can provide very stable performance over temperature since the integration time period and the capacitor can both be made relatively temperature stable. Capacitors normally have much greater stability then that of integrated circuit resistors. Also the active circuit amplifier gain variations have little effect on the integrator performance since normally a large level of negative feedback is used.

The integrator output voltage level can be used to indicate the sensor resistor current level. In other application the integrator can be used as a section of oscillators or pulse generators so as to provide a digital output signal that uses frequency or duty cycle to indicate the sensor resistor current level.

In voltage level output systems, the integrator has a stable integral of input current to output voltage ratio. The integration time period is controlled by an oscillator with a stable pulse width and frequency. The ratio of current into the integrator to current flow through the sense resistor is primarily determined by the resistance ratio of the sense resistor to input resistor. By maintaining the capacitor value, oscillator pulse width and frequency, and resistance ratio of the resistors substantially constant, the ratio of output voltage level of the current integrator to current level through the sensor resistor remains substantially constant over temperature variations.

In frequency or duty cycle output systems, the integrator has a stable time integral of input current to output voltage ratio. Two well known methods for varying the frequency or duty cycle dependant on the current level into the integrator are by measuring the time required for the integrator output voltage level to substantially equal a reference voltage level and the other is by maintaining the integrator output voltage level at a substantially constant level by using charge balancing techniques. As described above in the voltage level output system, the integrator has a stable integral of input current to output voltage ratio and by maintaining the capacitor value, and resistance ratio of the resistors substantially constant the output frequency or duty cycle for a given current level through the sensor resistor remains substantially constant over temperature variations.

An objective of this invention is to provide a current sensor system with a voltage level output signal that has a high temperature stability due to its reliance on stable oscillator pulse width and capacitors along with resistor ratios to set input current to output voltage ratios values. This circuit is substantially immune to the effects of temperature change.

Another objective is to provide a current sensor system with a frequency or duty cycle output signal that has a high temperature stability due to its reliance on stable current integrator circuits along with resistor ratios to set sensor resistor current level to integrator input current level. This circuit is substantially immune to the effects of temperature change.

Another objective is to provide an accurate over temperature current sensor system which can be built using commonly available integrated circuit components.

Also, another objective is to provide an accurate current sensor system without the need for resistor trimming which can be built using commonly available integrated circuit components.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

DETAILED DESCRIPTION OF THE INVENTION

Figure 1:
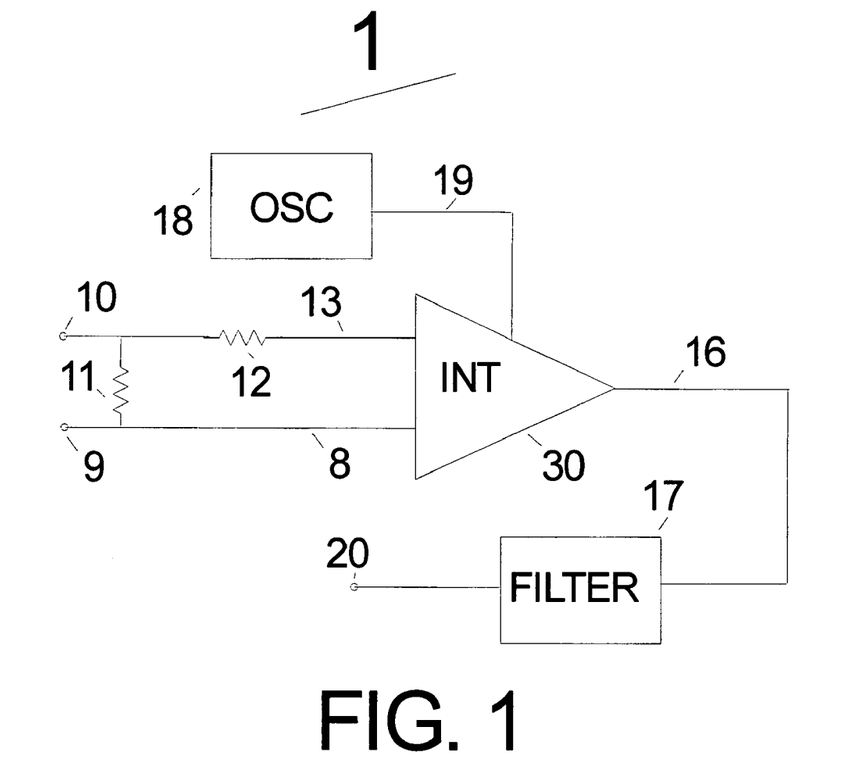
FIG. 1 shows a block diagram of current sensor system 1.

The current sensor system in FIG. 1 consist of sensor resistor 11 which is connected between the terminals 10 and 9. The external current level to be sensed flows into terminal 10 and out of terminal 9 or vice a versa. Line 13 connects one of the integrator 30 inputs to input resistor 12 and the other end of resistor 12 is connected to terminal 10. The other input of integrator 30 is by line 8 connected to terminal 9. Input resistor 12 is normally much larger in value than both of sensor resistor 11 or the input impedance of integrator 30. The current though input resistor 12 and also on line 8 has negligible effect on the voltage drop across sensor resistor 11. Oscillator 18 provides a constant frequency and pulse width output signal on line 19 that is applied to the control input of integrator 30. Integrator 30 integrates during the pulse width of the output signal on line 19 the current level flowing on line 13, and provides a voltage output on line 16 representing the value of the integrated current value. After the pulse ends the integrator 30 output is reset to a starting value which is normally zero and the integration cycle then repeats again. In most cases the percentage of time used for integration is much greater than the reset time. In the timing diagram shown in FIG. 2 examples of the wave forms and time relationship are given. Between time 0 and time 1 the output of oscillator 18 is low placing integrator 30 in the reset mode and causes it's output on line 16 to be zero volts. Between time 1 and time 2 the pulse output of oscillator 18 is high placing integrator 30 in the integrate mode and it's output voltage magnitude to increase with time in proportion to the current level on line 13. Between time 2 and time 3 the output of oscillator 18 is again low placing integrator 30 in the reset mode and it's output to be zero volts.

The voltage level between terminals 10 and 9 is substantially equal to the current level through sensor resistor 11 times the resistance of sensor resistor 11, since input resistor 12 has a much greater resistance than that of sensor resistor 11. The input impedance of integrator 30 between line 13 and 8 is low and effectively zero in comparison to the resistance of input resistor 12. The current level through input resistor 12 is substantially equal to the current level through sensor resistor 11 times the value of resistors 11 divided by that of input resistor 12. In effect resistor input resistor 12 and sensor resistor 11 can be considered to be in parallel to calculate their current levels. The integrator output on line 16 is applied to the input of filter 17. Filter 17 is a low pass filter that provides a DC voltage at output terminal 20 in proportion to the voltage level on line 16 that is substantially free of ripple related to oscillator 19.

Integrator 30 has a stable input current to output voltage ratio that is varied only by the pulse width and repetition rate of oscillator 18. By maintaining the output of oscillator 18 constant, the output voltage level of integrator 30 with a constant external current level through sensor resistor 11 is substantially dependant on only the resistance ratio of sensor resistor 11 to input resistor 12. Over temperature the time period of oscillator 18 can be maintained reasonably accurate however the value of the resistors 11 and 12 when constructed of materials commonly used in integrated circuits such as polysilicon have substantial value changes over temperature. By constructing the resistors of the same material, as is easily done in integrated circuits, the temperature performance of resistors 11 and 12 can be made substantially identical. Since the resistance ratio of resistors 11 and 12 remain substantially constant, the ratio of current through sensor resistor 11 to voltage on line 16 also remains substantially constant over temperature variations. If desired the ratio of sensor current to output voltage can be changed by varying the oscillator 18 pulse width and or frequency.

Figure 3:
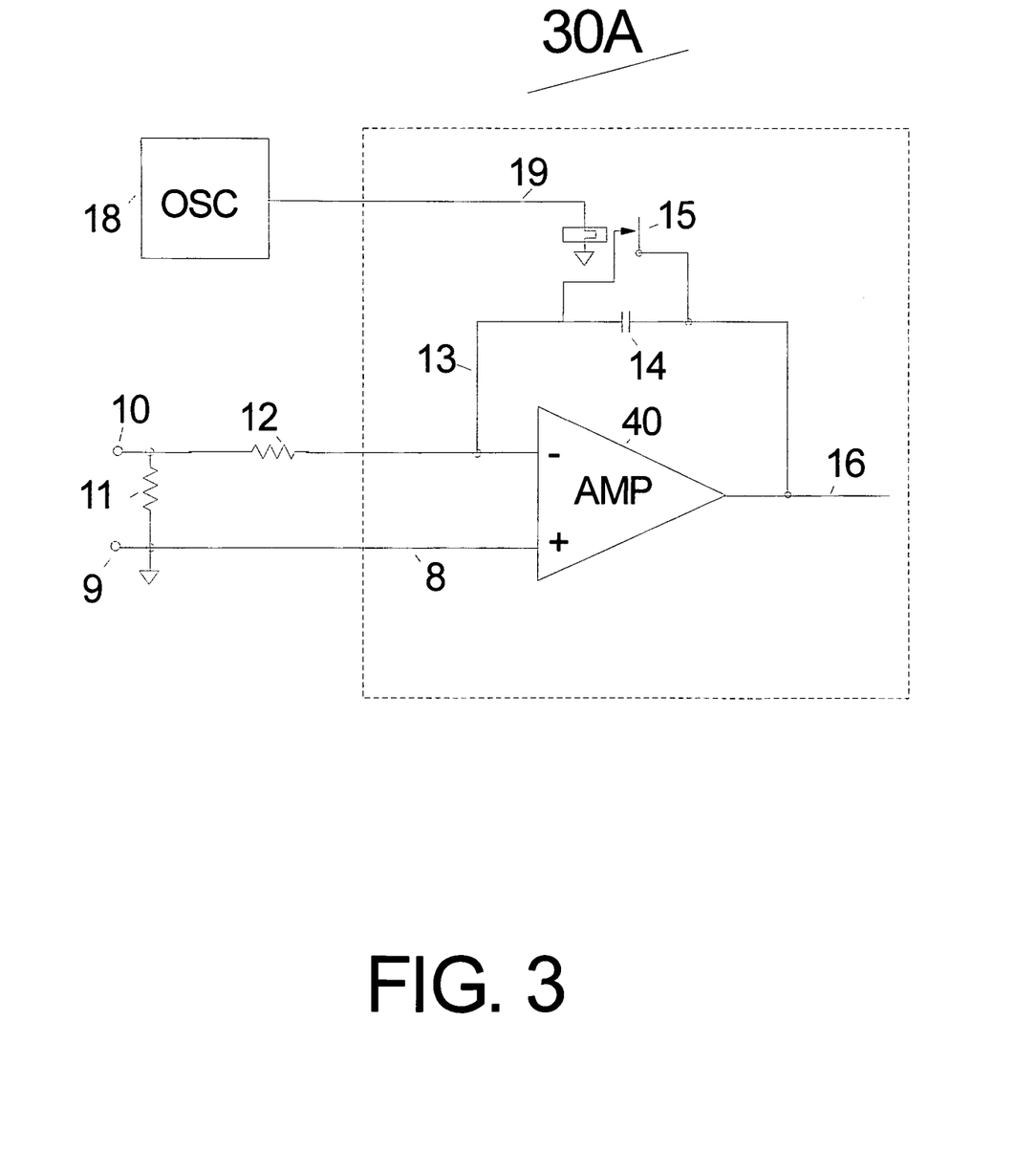
FIG. 3 shows details of integrator 30A.

One form of integrator 30 is shown in FIG. 3. Integrator 30A consisting operational amplifier 40, capacitor 14 and relay 15. Relay 15 is connected across capacitor 14 and controlled by the signal on line 19. Capacitor 14 is connected by line 16 to the output of operational amplifier 40 and by line 13 to the negative input of operational amplifier 40. Line 13 also connects input resistor 12 to the negative input of operational amplifier 40. Line 8 connects the positive input of operational amplifier 40 to terminal 9.

This integrator circuit is a well known in the art and is normally used when the input terminal 9 is connected to ground. It is obvious that the relay can be replaced by an semiconductor switching device such as a FET. The voltage level on line 13 is maintained substantially at 0 volts by using a high gain operational amplifier 40 and the current level on line 13 is substantially equal to the current level through sensor resistor 11 times the resistance of sensor resistor 11 divided by the resistance of input resistor 12.

Figure 2:
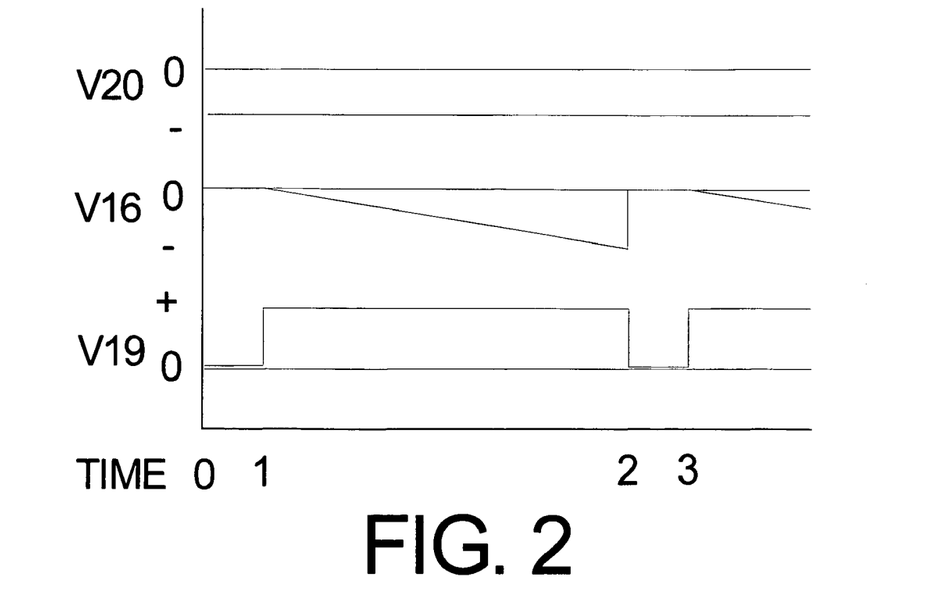
FIG. 2 shows timing diagram of the current sensor system 1.

In the timing diagram shown in FIG. 2 between time 0 and time 1 the output of oscillator 18 is low placing integrator 30A in the reset mode with relay 15 shorting out capacitor 14 and causing it's output on line 16 to be zero volts. Between time 1 and time 2 the pulse output of oscillator 18 is high placing integrator 30A in the integrate mode with relay 15 open and capacitor 14 being charged by the current through input resistor 12 and in response it's output voltage on line 16 becoming more negative with time assuming terminal 10 is positive with respect to terminal 9. Between time 2 and time 3 the output of oscillator 18 is again low placing integrator 30A in the reset mode with relay 15 shorting out capacitor 14 and causing it's output on line 16 to be zero volts.

When resistors 11 and 12 have the same temperature coefficient, temperature change has substantially no effect on the line 16 voltage level for a given current. The value of capacitor 14 and the time period and pulse width of oscillator 18 are substantially constant over temperature variations when compared to the resistors, so by reducing the error caused by resistor temperature coefficient the current sensor accuracy over temperature is improved.

Figure 4:
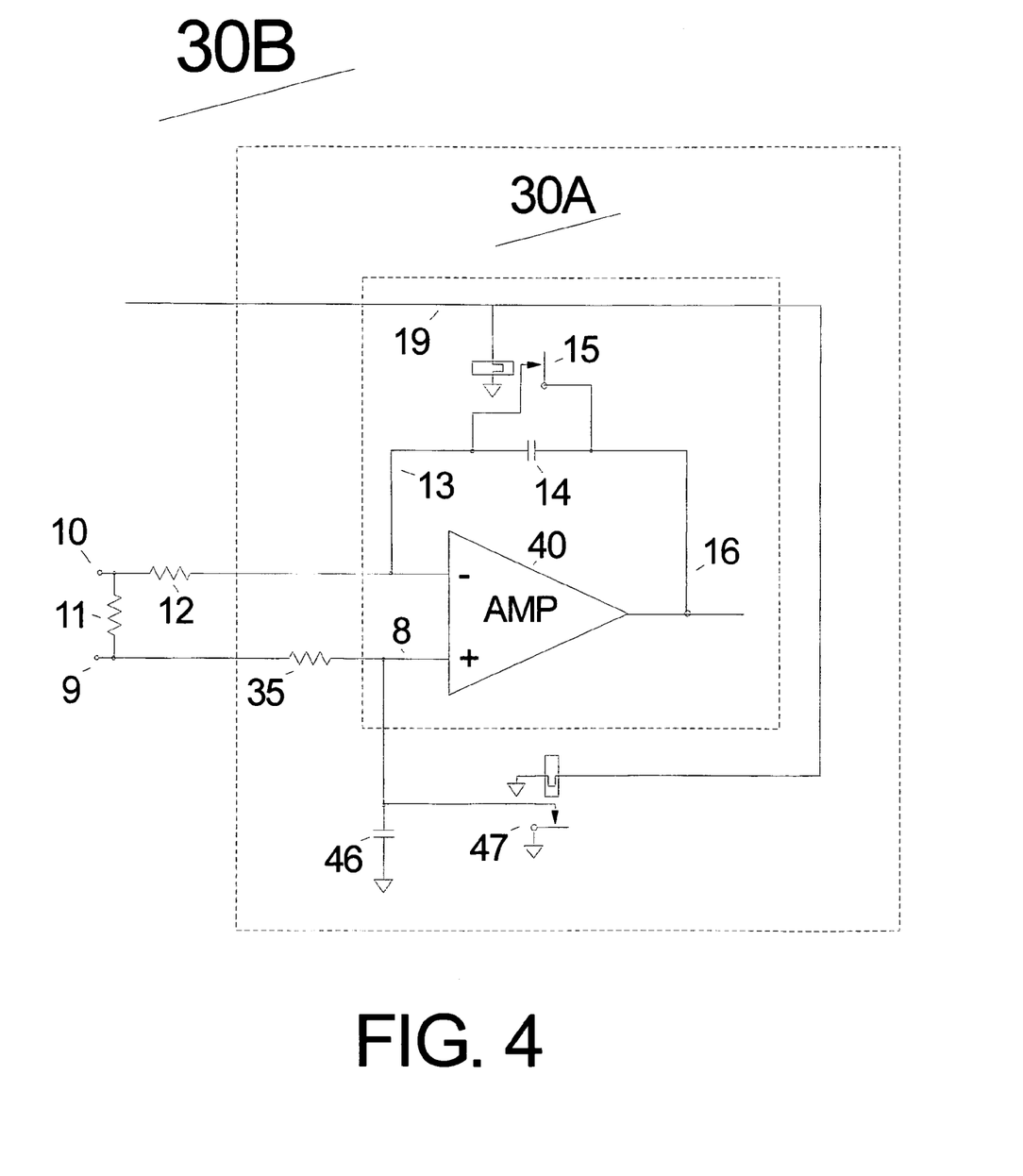
FIG. 4 shows details of integrator 30B.

Referring now to the integrator system 30B in FIG. 4. Differential input integrators are well known in the art. The differential input allows integrator 30B to have both terminal 10 and 9 at a different voltage than ground level. Differential input integrator 30B is created by adding capacitor 46, resistor 35 and relays 47 to integrator 30A. Line 8 of integrator 30A is connected to resistor 35, capacitor 46, and relay 47. The other end of resistor 35 is connected to terminal 9 and sensor resistor 11. The other ends of capacitor 46 and relay 47 are connected to ground. Relay 47 is controlled by the signal on line 19 and closes and opens when relay 15 does the same. Resistor 35 is matched in value and electrical characteristics to input resistor 12 and capacitor 46 is matched in value and electrical characteristics to capacitor 14. The value of capacitor 14 and 46, and the time period and pulse width of oscillator 18 are substantially constant over temperature variations when compared to the resistors. When resistors 11, 35, and 12 have the same temperature coefficient, temperature change has substantially no effect on the line 16 voltage level for a given input current.

Figure 5:
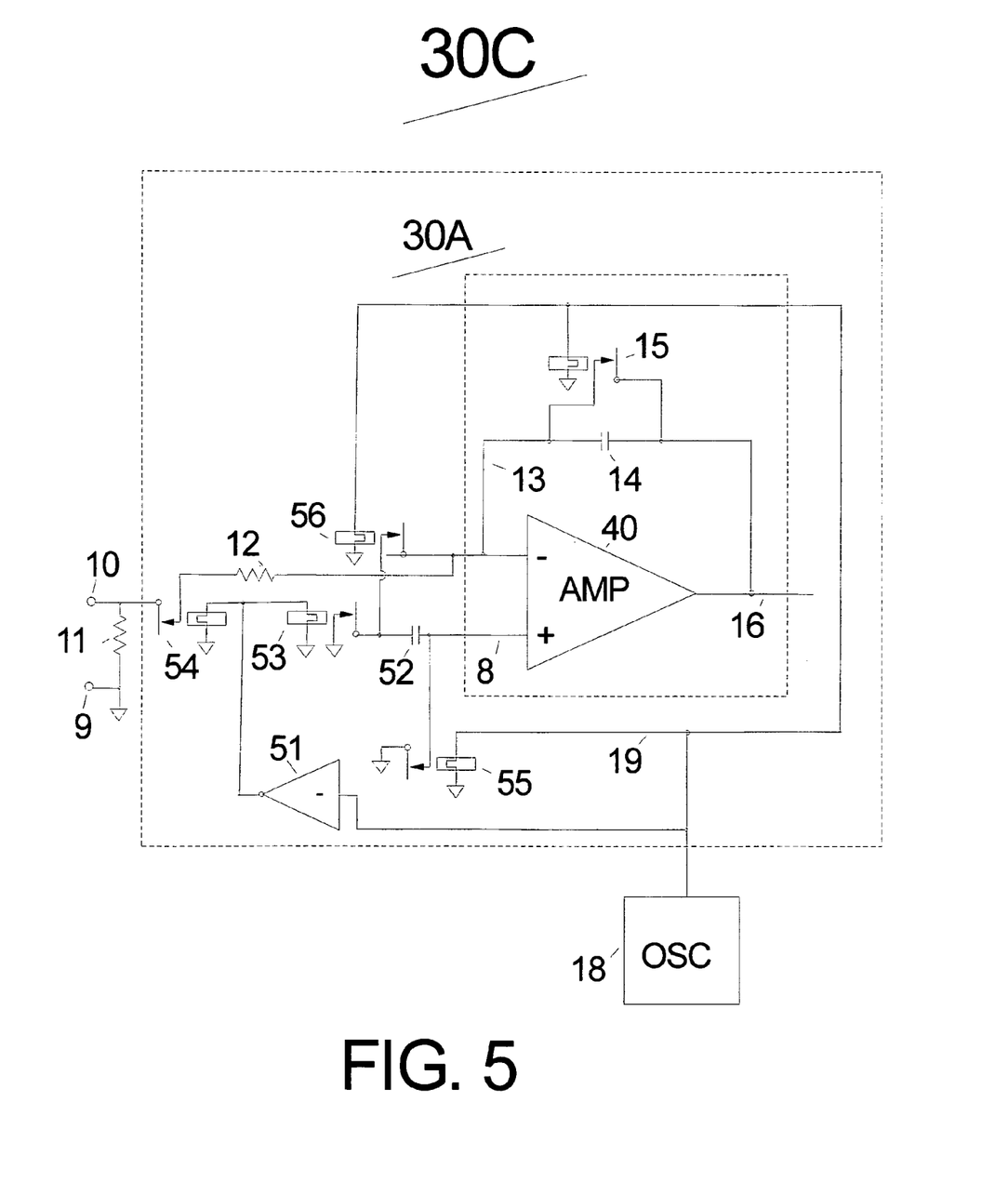
FIG. 5 shows details of integrator 30C.

An addition source of error is caused by the offset voltage of non-ideal operational amplifiers used as part of the integrator. There are were known in the art means for reducing the resultant offset voltage error, one of the methods is to use auto-zero. FIG. 5 shows as an example integrator 30A to which one circuit version of auto-zero has been added to form an reduced offset voltage error integrator, integrator 30C Integrator 30C consist of integrator 30A with inverter 51, capacitor 52, and relays 53, 54, 55, 56 added. One end of capacitor 52 and relay 55 is connected to line 8. The other end of relay 55 is connected to ground. The other end of capacitor 52 is connected to one side of relays 53 and 56. The other end of relay 53 is connected to ground. The other end of relay 56 is connected to line 13. One side of relay 54 is connected to terminal 10 and the other side to input resistor 12. The input of inverter 51 is connected to line 19 and it's output controls relays 54 and 53.

In the timing diagram shown in FIG. 2 between time 0 and time 1 the output of oscillator 18 is low placing integrator 30C in the reset and offset reduction mode with relay 15 shorting out capacitor 14, relay 55 connecting line 8 to ground, and relay 56 connecting capacitor 52 to line 13. This results in capacitor 52 being charged to level of the offset voltage which is on line 16. The output of inverter 51 is high keeping the contacts of relays 54 and 53 open.

Between time 1 and time 2 the output of oscillator 18 is high placing integrator 30C in the integrate mode with relay 15, 55, and 56 open. The output of inverter 51 is low keeping the contacts of relays 54 and 53 closed. On side of input resistor 12 is now connected through relay 54 to terminal 10 to allow capacitor 14 to be charged by the current through input resistor 12 with the voltage on line 16 becoming more negative with time assuming terminal 10 is positive with respect to terminal 9. One side of capacitor 52 is now connected to ground through relay 53. The other side of capacitor 52 is connected to line 8 with the voltage level on line 8 now of a value to substantially cancel that of the offset voltage. Between time 2 and time 3 the output of oscillator 18 is again low placing integrator 30C in the reset and offset reduction mode and it's output on line 16 at the level of the offset voltage.

Figure 6:
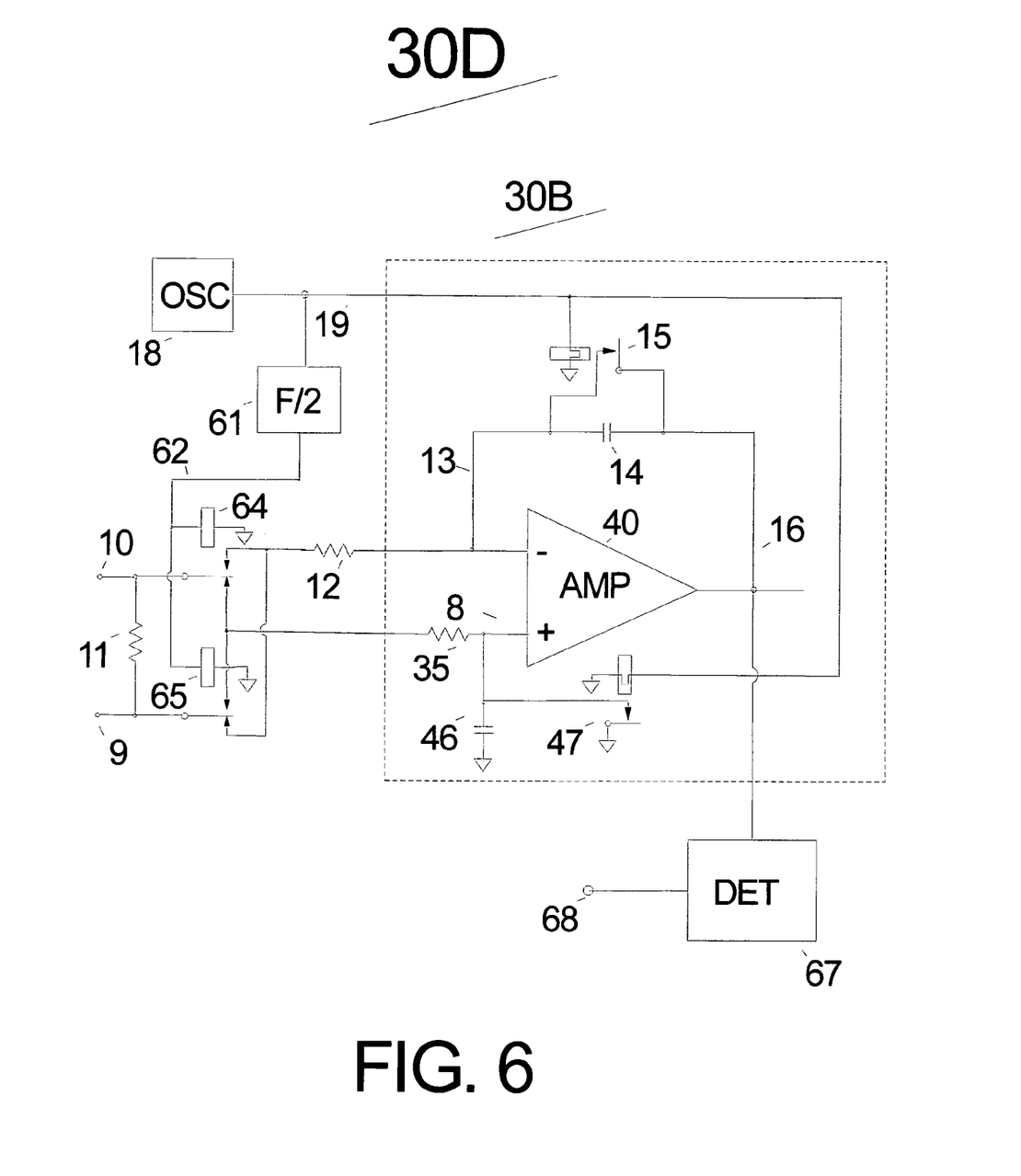
FIG. 6 shows a block diagram of current sensor system 30D.
Figure 7:
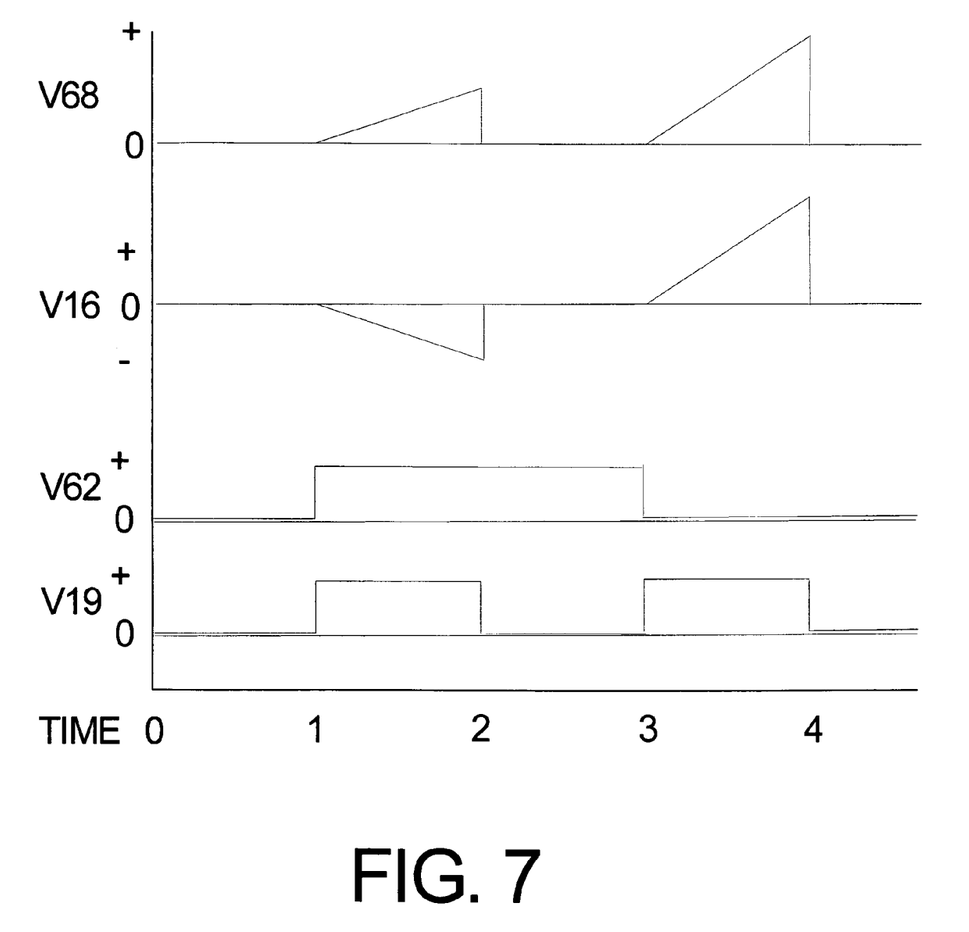
FIG. 7 shows timing diagram of the current sensor system 30D.

FIG. 6 shows as an example integrator 30B to which an other circuit technique for auto zero has been added to form an reduced offset voltage error current sensor system, current sensor 30D. Current sensor 30D can also be used to reduce the output signal 16 error due to the mismatch in values between input resistor 12 and 35 and also between capacitor 14 and 46. Current sensor 30D consist of integrator 30B with frequency divider 61, resistors 11, 12, relays 64, 65 and detector 67 added. The input of frequency divider 61 is connected to line 19 and it's output controls relays 64 and 65. When the frequency divider 61 output is high relay 64 connects input resistor 12 to terminal 10, and relay 65 connects input resistor 35 to terminal 9. When the of frequency divider 61 output is low relay 64 connects input resistor 12 to terminal 9 and relay 65 connects input resistor 35 to terminal 10. The other end of input resistor 12 is connected to line 13 and the other end of resistor 35 is connected to line 8. Sensor resistor 11 is connected between terminal 10 and 9. The output of frequency divider 61 changes state every other time oscillator 18 changes state (high/low). Line 16 of integrator 30B is also connected to the input of detector 67. The output of detector 67 is proportional to the magnitude of it's input signal and is applied to terminal 68. For example when the voltage level on line 16 is negative the terminal 68 voltage is positive and when the voltage level on line 16 is positive the terminal 68 voltage is also positive as shown in FIG. 7. The terminal 68 signal level difference between when the frequency divider 61 output is low and high and integrator 30B is in the integrate mode can be processed to substantially remove the errors due to mismatch in values between input resistor 12 and 35 and also between capacitor 14 and 46 to more accurately determine the true current level through sensor resistor 11. For example in FIG. 7 at time 2 the voltage at terminal 68 is 1.6 volts and at time 4 the voltage at terminal 68 is 2 volts the voltage at terminal 68 without being effecting by the errors would be at time 2, 1.8 volts and at time 4 the voltage 1.8 volts. The accurate voltage value of 1.8 v could be obtained from the voltage levels containing the error by taking the average value of the measurements at time 2 and 4.

In the timing diagram shown in FIG. 7 between time 0 and time 1 the output of oscillator 18 is low placing integrator 30B in the reset mode with relay 15 shorting out capacitor 14, and relay 47 connecting line 8 to ground. The frequency divider 61 output is low and relay 64 connects input resistor 12 to terminal 9 and relay 65 connects input resistor 35 to terminal 10.

Between time 1 and time 2 the output of oscillator 18 is high placing integrator 30B in the integrate mode with relay 15, and 47 open. The frequency divider 61 output is high and relay 64 connects input resistor 12 to terminal 10 and relay 65 connects input resistor 35 to terminal 9.

Between time 2 and time 3 the output of oscillator 18 is again low placing integrator 30B in the reset mode. The frequency divider 61 output remains high and relay 64 connects input resistor 12 to terminal 10 and relay 65 connects input resistor 35 to terminal 9.

Between time 3 and time 4 the output of oscillator 18 is again high placing integrator 30B in the integrate mode with relay 15, and 47 open. The frequency divider 61 output is again low and relay 64 connects input resistor 12 to terminal 9 and relay 65 connects input resistor 35 to terminal 10.

Figure 8:
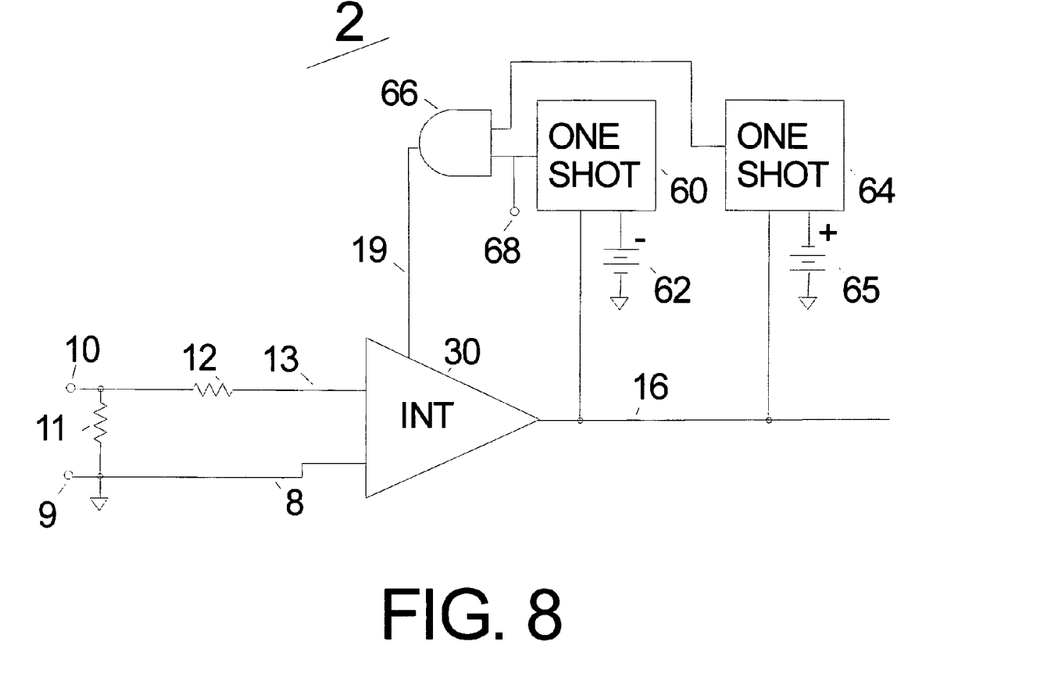
FIG. 8 shows a block diagram of current sensor oscillator system 2.

The level of current flow can also be indicated by varying the frequency of the output signal. The current sensor oscillator system 2 in FIG. 8 shows one method of doing this. It consist of sensor resistor 11 which is connected between the terminals 10 and 9. The external current level to be sensed flows into terminal 10 and out of terminal 9. Terminal 9 is normally connected to ground. Line 13 connects one of the integrator 30 inputs to one side of input resistor 12 with the other side of input resistor 12 connected to terminal 10. The other input of integrator 30 is by line 8 connected to terminal 9. Input resistor 12 is normally much larger in value than both sensor resistor 11 and also the input impedance of integrator 30. The current though input resistor 12 has substantially negligible effect on the voltage drop across sensor resistor 11. During integration the voltage output on line 16 represents the value of the integrated current value of the current level flowing on line 13. For an example, when the current flow direction into terminal 10 causes terminal 10 polarity to be positive in respect to terminal 9 the integrator output voltage level on line 16 goes negative and positive when terminal 10 polarity is negative in respect to terminal 9.

When the voltage level on line 16 goes negative and substantially reaches the level of voltage reference 62 the one shot pulse generator 60 provides a output signal which is a narrow pulse going from high to low level of stable time duration at terminal 68 and the input of AND gate 66. When the voltage level on line 16 goes positive and substantially reaches the level of voltage reference 65 the one shot pulse generator 64 provides a output signal which is a narrow pulse going from high to low level of stable time duration at the other input of AND gate 66.

When a pulse is applied to either input of AND gate 66, the output of AND gate 66 on line 19 has a substantially identical pulse width as at it's input. The pulse on line 19 is applied to the control input of integrator 30. Integrator 30 output is reset to a starting value which is normally zero and begins to integrate again at the end of the pulse. The frequency of the pulses on line 19 varies in relationship to the current level that flows into terminal 10, the higher the current level magnitude the faster the integrator 30 output level reaches that of voltage reference 62 or 65. In addition the presence or absence of a pulse at terminal 68 indicates the polarity of the current flow into terminal 10. Thus the pulse frequency on line 19 and the presence or absence of pulses at terminal 68 indicates the magnitude and polarity of the current level into terminal 10.

Figure 9:
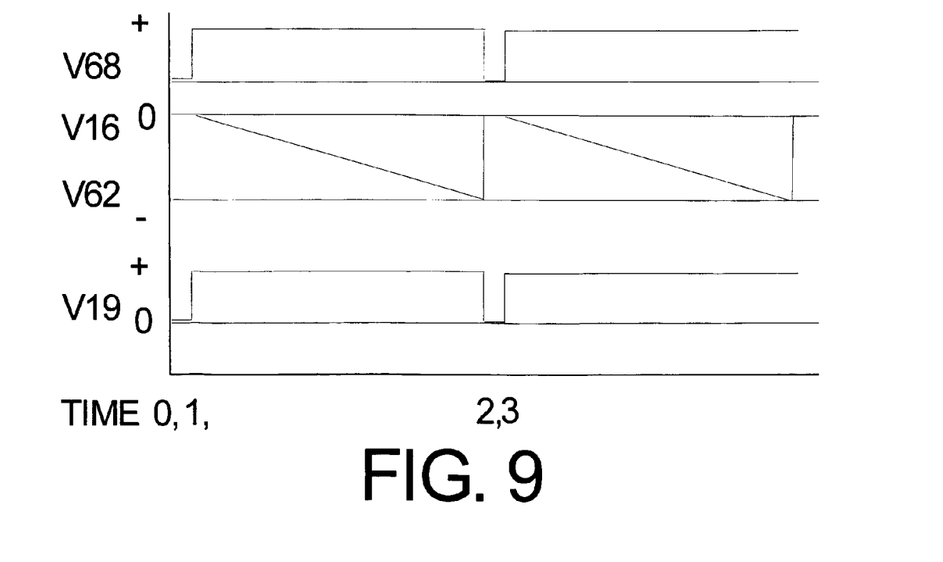
FIG. 9 shows timing diagram of the current sensor oscillator system 2.

In the timing diagram shown in FIG. 9 examples of the wave forms and time relationship are given. The current flow into terminal 10 is such that the integrator 30 output level goes negative with time. At time 0 the output of the one shot pulse generator 60 goes low and a pulse is present at terminal 68 and on line 19. Between time 0 and time 1 integrator 30 is in the reset mode causing it's output on line 16 to be zero volts. At time 1 the one shot pulse generator 60 pulse ends. Between time 1 and time 2 integrator 30 is in the integrate mode and it's output voltage becomes more negative with time in proportion to the current level on line 13 which is proportional to the current level through sensor resistor 11. At time 2 the voltage level substantially equals the voltage level of voltage reference 62 and the one shot pulse generator 60 output goes low again. Between time 2 and time 3 the output of the one shot pulse generator 60 remains low placing integrator 30 in the reset mode and it's output to be zero volts.

Figure 10:
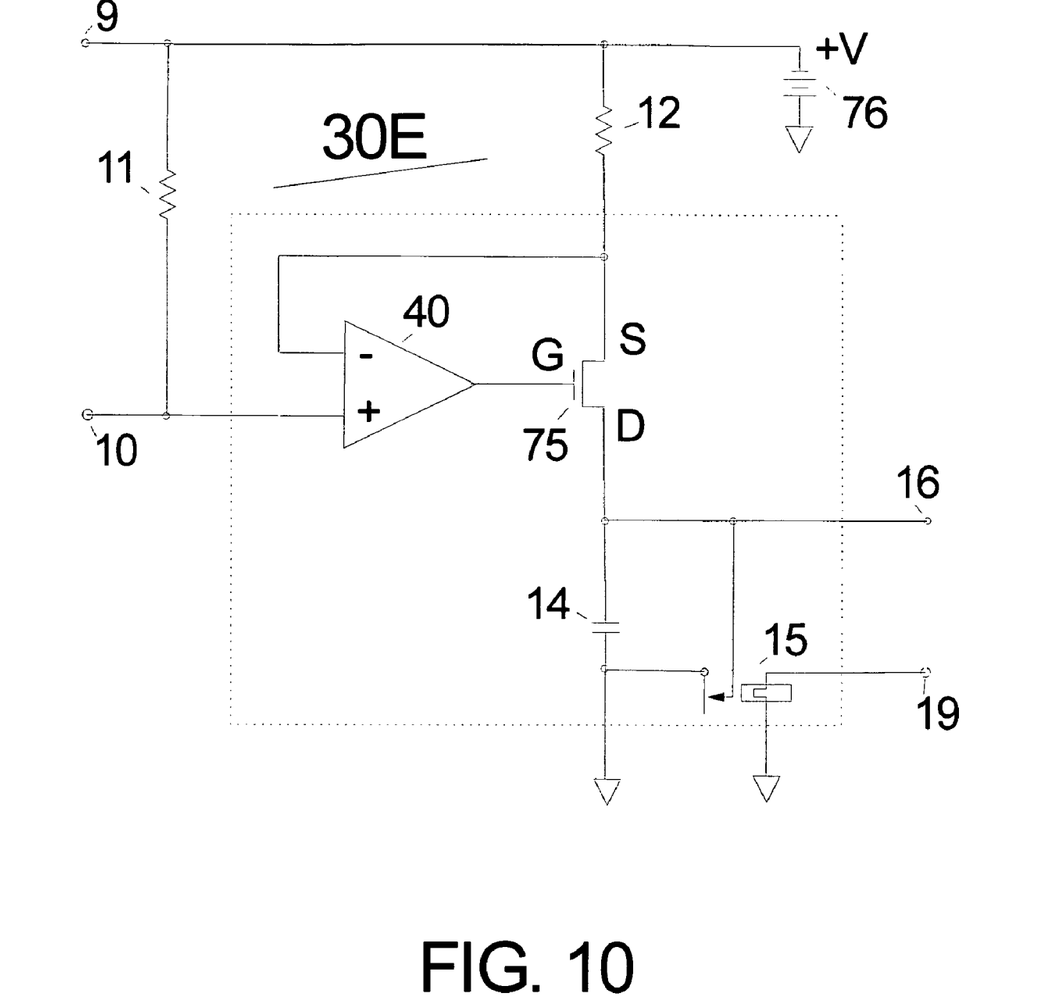
FIG. 10 shows details of integrator 30E

Another form of integrator 30 is shown in FIG. 10. Integrator 30E consisting of operational amplifier 40, capacitor 14, FET 75, and relay 15. Relay 15 is connected across capacitor 14 and controlled by the signal on line 19. Capacitor 14 is connected between ground and line 16 and the drain of P channel FET 75. The gate of FET 75 is connected to the output of operational amplifier 40 and the source of FET 75 is connected to the negative input of operational amplifier 40 and one side of input resistor 12. The other side of input resistor 12 is connected to terminal 9 and battery 76. The negative terminal of battery 76 is connected to ground. Sensor resistor 11 is connected between terminal 9 and 10. Terminal 10 is also connected to the positive input of operational amplifier 40.

This integrator circuit 30E is a well known in the art. The voltage level between operational amplifier 40 positive and negative inputs is maintained substantially at 0 volts by using a high gain operational amplifier 40 and the current level through input resistor 12 is substantially equal to the current level through sensor resistor 11 times the resistance of sensor resistor 11 divided by the resistance of input resistor 12. When the contact of relay 15 is open and negligible current is being drawn by an external load connected to line 16, the current flow into capacitor 14 is substantially equal to that of input resistor 12.

Figure 11:
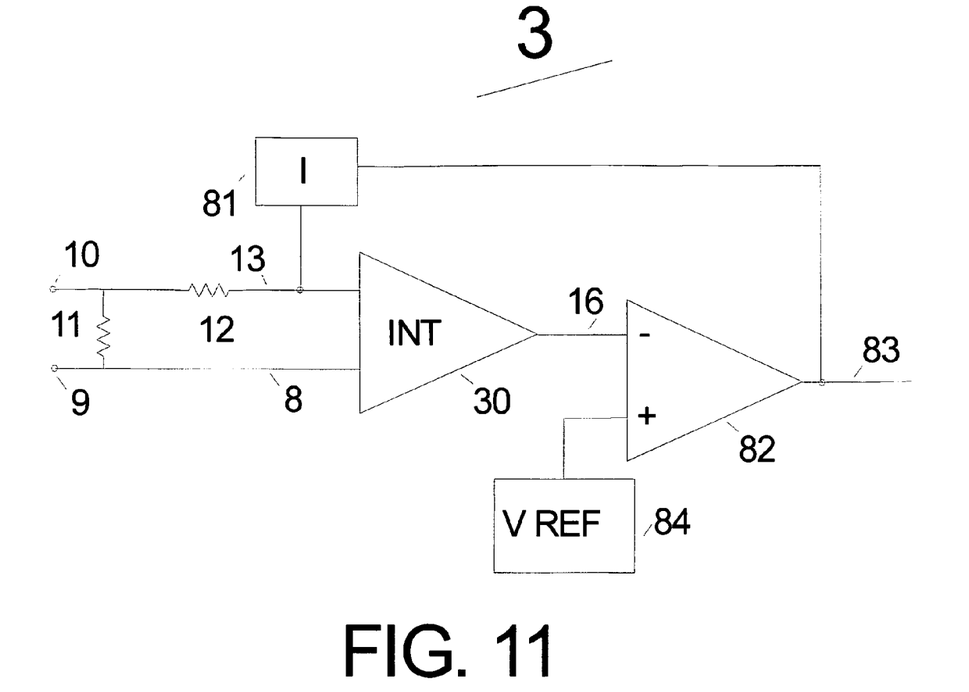
FIG. 11 shows a block diagram of current sensor oscillator system 3.

The level of current flow can also be indicated by varying the duty cycle of the output signal. The current sensor oscillator system 3 in FIG. 11 shows one method of doing this by trying to maintaining the integrator output voltage level at a substantially constant level by using charge balancing techniques. It consist of sensor resistor 11 which is connected between the terminals 10 and 9. The external current level to be sensed flows into terminal 10 and out of terminal 9. Terminal 9 is normally connected to ground. Line 13 connects one of the integrator 30 inputs to one side of input resistor 12 and also to the output of constant current source 81. The other side of input resistor 12 connected to terminal 10. The other input of integrator 30 is by line 8 connected to terminal 9. Input resistor 12 is normally much larger in value than both sensor resistor 11 and also the input impedance of integrator 30. The voltage level across line 13 and 8 is zero. The current though input resistor 12 has substantially negligible effect on the voltage drop across sensor resistor 11. Integrator 30 output is on line 16 and is applied to one input of comparator 82. The output of comparator 82 is on line 83 and applied to the input of constant current source 81. The output of voltage reference 84 is applied to the other input of comparator 82.

During integration the voltage output level on line 16 represents the integrated current value of the current level flowing on line 13. For an example, when the current flow direction into terminal 10 causes terminal 10 polarity to be positive in respect to terminal 9 the integrator output voltage level on line 16 goes decreases with time and the constant current source 81 output polarity is the opposite to cause the voltage level on line 16 to increase with time.

Comparator 82 has an input hysteresis centered around the voltage level of voltage reference 84 which may be set at zero volts as used in this example. When the voltage level on line 16 goes negative and substantially reaches the level of voltage reference 84 minus the level of input hysteresis the comparator 82 output on line 83 goes high causing constant current source 81 to output a fixed current level to line 13. This causing the voltage level on line 16 to increase with time.

When the voltage level on line 16 goes positive and substantially reaches the level of voltage reference 65 plus the input hysteresis, the comparator 82 output on line 83 goes low and constant current source 81 output is now zero current. This causing the voltage level on line 16 to now decrease with time.

The duty cycle of the pulses on line 83 varies in relationship to the ratio of current level that flows into terminal 10 to that of the constant current source 81 output level. The greater the current level magnitude on line 13 the faster the integrator 30 output level reaches the switching point of comparator 82.

Figure 12:
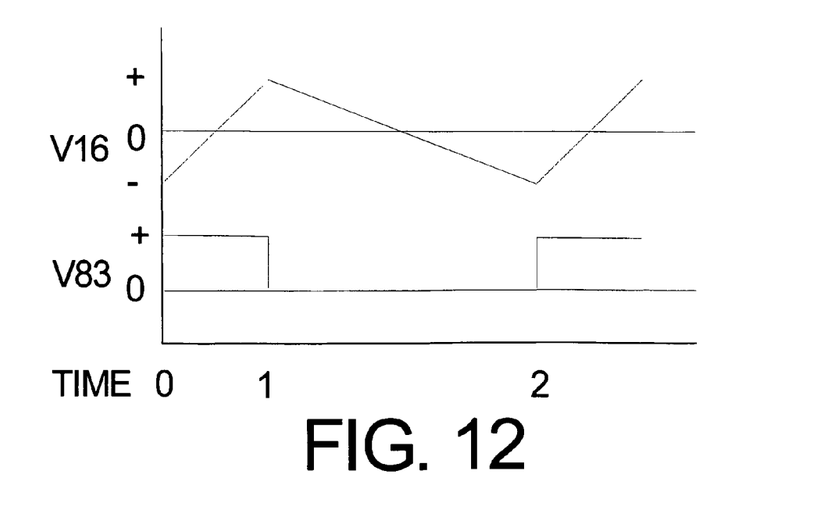
FIG. 12 shows timing diagram of the current sensor oscillator system 3.

In the timing diagram shown in FIG. 12 examples of the wave forms and time relationship are given. The current flow into terminal 10 is such that the integrator 30 output level decreases with time. At time 0 the voltage level on line 16 substantially equals the switching level of comparator 82 causing the output on line 83 to go high. When the signal on line 82 is high between time 0 and time 1, constant current source 81 output sources current to line 13 causing integrator 30 output on line 16 to increase with time in proportion to the current level on line 13. At time 1 the voltage level on line 16 substantially equals the switching level of comparator 82 causing the output on line 83 to go low. Between time 1 and time 2 only input resistor 12 supplies current to line 13 with constant current source 81 output at zero current level. Integrator 30 output voltage level decreases with time in proportion to the current level on line 13 which is proportional to the current level through sensor resistor 11. At time 2 the voltage level on line 16 substantially equals the switching level of comparator 82 causing the output on line 83 to again go high.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the claims.

What is claimed is:

1. A current sensor system in which the current level to be measured flows through a resistor, comprising:
   said resistor which develops a voltage drop across said resistor in proportion to current level through said resistor;

a second resistor having a voltage applied across it in proportion to said voltage drop across said resistor causing a current to flow through said second resistor;

a current integrator means for integrating over time the level of current through said second resistor to provide an output voltage level in response to said integration;

said current integrator means receives a reset pulse to control integration time period; and said output voltage level indicating current level through said resistor and integration time period.

2. The system of claim 1 having reduced temperature error wherein said resistor and said second resistor have similar temperature dependence.

3. The system of claim 1 wherein the said current integrator means output voltage level further controls a digital output signal.

4. The system of claim 1 having reduced error wherein offset voltage reduction means are applied.

5. A current sensor system configured to be connected to receive an external current signal, the external current signal having an external current level, said current sensor system comprising:

a first resistive element, the first resistive element having a respective first input terminal, the first input terminal being configured to receive at least a substantial portion of the external current signal, the first resistive element having a respective first output terminal, the first resistive element being configured to carry a first current flowing through the first resistive element between the first input terminal and the first output terminal, the first current having a respective first current level, the first current flowing through the first resistive element developing a first voltage drop, the first voltage drop being measurable across the first resistive element between the first input terminal and the first output terminal, the first voltage drop being proportional to the first current level, the first current level being proportional to the external current level;

a second resistive element, the second resistive element having a respective second input terminal, the second resistive element having a respective second output terminal, the second resistive element being configured to carry a second current flowing through the second resistive element between the second input terminal and the second output terminal, the second current having a respective second current level, an applied voltage being applied across the second resistive element to cause the second current to flow through the second resistive element, the applied voltage being proportional to the first voltage drop, the second current level being proportional to the applied voltage; and a current integrator, the current integrator having a respective integrator input, the integrator input being connected to receive an integrator input current, the integrator input current being proportional to the second current level, the integrator input current having an integrator input current level, the current integrator being configured for integrating over time the integrator input current level to provide an integrator output signal, the integrator output signal indicating the external current level.

6. A current sensor system according to claim 5 and further comprising:

the current integrator providing one of the following:

a voltage output signal proportional to the external current level, an output frequency signal proportional to the external current level, and an output variable duty cycle signal proportional to the external current level.

7. The system of claim 5 wherein the first resistive element and the second resistive element have similar temperature dependence, whereby temperature error of said current sensor system is reduced.

8. A current sensor system according to claim 5 wherein further:

the integrator output signal comprises an output voltage level in response to said integration;

the current integrator receives reset pulses to control integration time period;

said output voltage level returns to a predetermined level when said current integrator receives a reset pulse;

the current sensor system further comprising:

voltage reference means for supplying a reference voltage level;

comparator means for comparing said output voltage level to said reference voltage level;

said comparator means generating said reset pulse when said output voltage level substantially equals said reference voltage level;

whereby said reset pulse occurs at a frequency responsive to external current level.

9. A current sensor system according to claim 5 and further comprising:

voltage reference means for supplying a reference voltage level;

comparator means for comparing said output voltage level to said reference voltage level, the comparator means having input hysteresis;

said comparator means generating a pulse when the output voltage level is greater than said voltage reference means voltage level plus said input hysteresis;

a current reference source for supplying a predetermined current level of opposite polarity to said current flow through said second resistor in response to said pulse;

the current integrator input receiving current level proportional to both the second resistive element and said current reference source for integrating over time the level of input current to provide a resultant output voltage level; whereby duty cycle of said pulse is proportional to ratio of current level through the second resistive element and said current reference source.

* * * * *